United States Patent [19]

Saitoh et al.

[11] Patent Number: 5,061,511
[45] Date of Patent: Oct. 29, 1991

[54] METHOD FOR FORMING FUNCTIONAL DEPOSITED FILMS BY MEANS OF MICROWAVE PLASMA CHEMICAL VAPOR DEPOSITION METHOD

[75] Inventors: Keishi Saitoh; Junichiro Hashizume, both of Nagahama; Shigehira Iida, Ueno; Tetsuya Takei; Takayoshi Arai, both of Nagahama, all of Japan

[73] Assignee: Canon Kabushiki Kaisha, Tokyo, Japan

[21] Appl. No.: 551,081

[22] Filed: Jul. 11, 1990

Related U.S. Application Data

[60] Division of Ser. No. 287,666, Dec. 21, 1988, Pat. No. 4,957,772, which is a continuation of Ser. No. 130,448, Dec. 9, 1987, abandoned.

[30] Foreign Application Priority Data

Dec. 12, 1986 [JP] Japan ............................... 61-297421
Dec. 13, 1986 [JP] Japan ............................... 61-296994

[51] Int. Cl.[5] ................................................. B05D 3/06
[52] U.S. Cl. ................................... 427/38; 427/45.1
[58] Field of Search ................................. 427/45.1, 38

[56] References Cited

U.S. PATENT DOCUMENTS 4,517,223 5/1985 Ovshinsky et al. ................... 427/39
4,715,927 12/1987 Johncock et al. ................... 156/606

Primary Examiner—Bernard Pianalto
Attorney, Agent, or Firm—Fitzpatrick, Cella, Harper & Scinto

[57] ABSTRACT

An improved method for forming a functional deposited film by introducing a raw material gas into a substantially enclosed reaction chamber containing a substrate onto which the functional deposited film is to be deposited and coupling microwave energy from a source of microwave energy thereinto to thereby form a glow discharge plasma causing decomposition of the raw material gas whereby forming the functional deposited film on the substrate, the improvement comprising supplying microwave of a power equivalent of 1.1 times or more over that of microwave with which the deposition rate for the decomposed products from the raw material gas being deposited onto the substrate to be saturated to the raw material gas in the reaction chamber and regulating the inner pressure of the reaction chamber to a vacuum of 10 m Torr or less.

According to the method of this invention, there can be formed a desired functional deposited film having a wealth of many practically applicable characteristics and having an improved response speed against photocurrent at an improved deposition rate with a raw material gas utilization efficiency of hundred percent or nearly hundred percent. And the method of this invention makes it possible to mass-produce various functional elements comprising such deposited film usable in electrophotographic photosensitive member, photosensor, thin-film transistor, solar cell, etc. on an industrial scale thereby enabling low cost production.

6 Claims, 5 Drawing Sheets

METHOD FOR FORMING FUNCTIONAL DEPOSITED FILMS BY MEANS OF MICROWAVE PLASMA CHEMICAL VAPOR DEPOSITION METHOD

This application is a division of application Ser. No. 287,666 filed Dec. 21, 1988, U.S. Pat. No. 4,957,772, which in turn is a continuation of application Ser. No. 130,448 filed Dec. 8, 1987, now abandoned.

FIELD OF THE INVENTION

This invention relates to an improved method for forming a functional deposited film such as amorphous silicon film, amorphous germanium film, amorphous silicon-germanium film, amorphous silicon carbide film, amorphous silicon nitride film, or amorphous silicon oxide film which may be immobilized as an amorphous semiconductor material and which is usable as a semiconductor element in electrophotographic photosensitive member, thin-film transistor, photosensor, solar cell and the like. More particularly, it relates to an improved method for forming the foregoing functional deposited film by means of a microwave plasma chemical vapor deposition method (hereinafter referred to as "MV-PCVD method").

BACKGROUND OF THE INVENTION

Hitherto, there have been provided various kinds of functional deposited films which are so-called amorphous semiconductor material films. Along with the provision of such functional deposited films, there have been proposed various methods by means of a MW-PCVD process for forming them such as disclosed in the specification of U.S. Pat. No. 4,504,518.

According to such known method, it is possible to form a functional deposited film with a practically acceptable utilization efficiency of a raw material gas and also with a practically acceptable deposition rate.

However, for any of the functional deposited films obtained by means of such known MW-PCVD method, there are still unsolved problems regarding the film quality in that it has a prismatic structure and with regard to performance characteristics, particularly optical and electric characteristics upon repeated use. Because of this, they can be applied only for limited purposes, so that they are not widely used. For instance, in the case of employing such film as a photosensitive element in electrophotographic photosensitive member or laser beam printer, although it is satisfactory in the terms of dark conductivity and photoconductivity, there are problems in that the speed of response for the photoconductivity is slow and because of this, there often occur ghosts. These problems will become significant in the case of an electrophotographic photosensitive member that has a light receiving layer of large area and large layer thickness. Likewise, in the case where such film is employed as a constituent semiconductor element in solar cell, thin-film transistor, photosensor, etc., the resulting device will often exhibit a slow speed of response for photoconductivity and a lack in quick response characteristics.

The principal cause for the foregoing problems is understood to because it is difficult for the known MW-PCVD method to form a functional deposited film and to maintain a microwave plasma discharge in a stable state for a long period of time. The microwave plasma discharge soon becomes turbulent thereby causing undesired changes particularly in the electric characteristics of the resulting film.

SUMMARY OF THE INVENTION

The present inventors have conducted extensive studies in order to solve the problems in the aforementioned known MW-PCVD method and in order to make appropriate improvements therefor so as to make it possible to effectively form a widely usable functional deposited film having a wealth of many practically applicable characteristics without such problems as found on the known MW-PCVD method.

As a result, the present inventors have finally developed an improved MW-PCVD method that enables efficient and stable formation of a desired functional deposited film which is widely usable as a semiconductor element in electrophotographic photosensitive member, thin-film transistor, photosensor, solar cell and the like.

It is therefore an object of this invention to provide an improved MW-PCVD method which enables one to effectively and stably form a functional deposited film such as a semiconductor material film which excels in optical and electric characteristics and which is widely usable as a semiconductor element in the foreging various devices.

Another object of this invention is to provide an improved MW-PCVD method which enables one to effectively and stably form a functional deposited amorphous film such as an amorphous semiconductor material film which excels in optical and electric characteristics and which is widely usable as a semiconductor element in the foregoing various devices at high deposition rate without generation of polysilane powder caused by polymerization of a raw material gas.

A further object of this invention is to provide an improved MW-PCVD method which makes essentially or substantially one hundred percent of the raw material gas to be utilized in the formation of the aforesaid functional deposited amorphous film at a high deposition rate and which makes it possible to mass-produce said film on an industrial scale thereby enabling low cost production.

These and other objects, as well as the features of this invention will become apparent by reading the following descriptions of preferred embodiments according to this invention while referring to the accompanying drawings.

DESCRIPTION OF THE INVENTION

Figure 2:
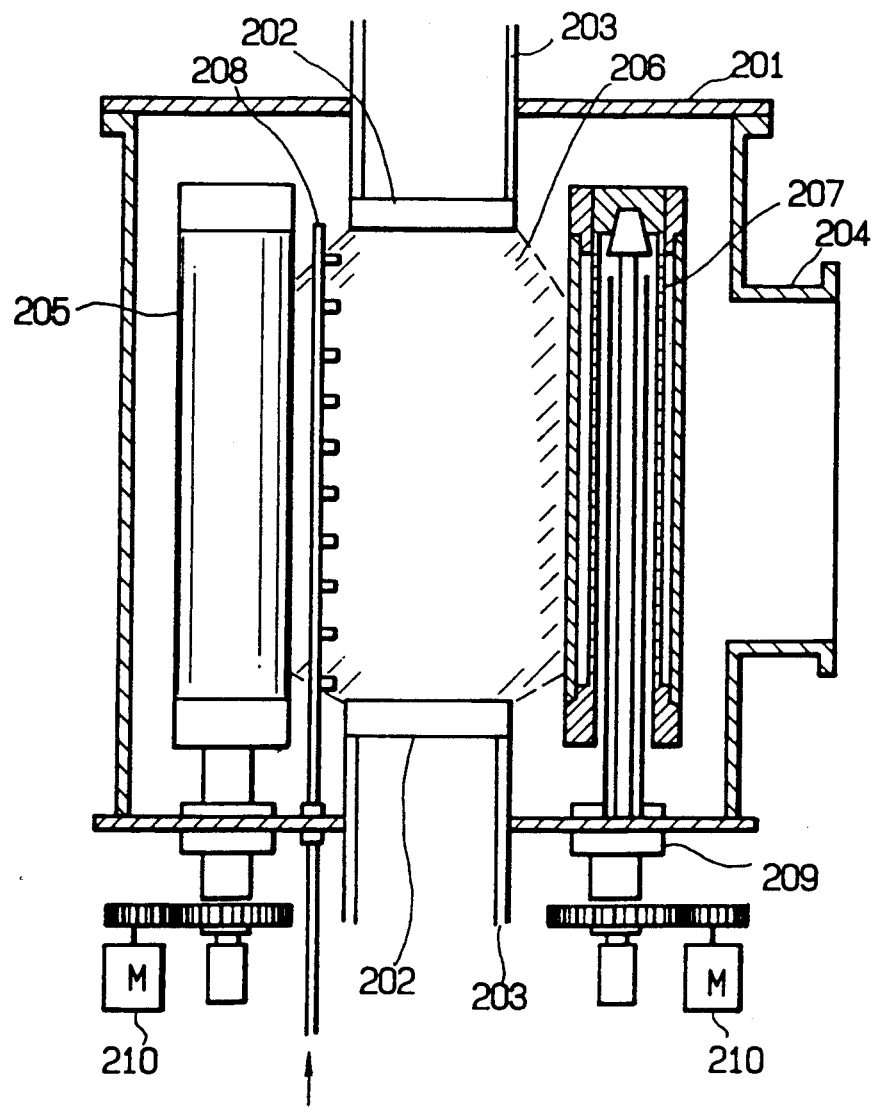
FIG. 2 is schematic cross-sectional view of a MW-PCVD apparatus suited for practicing the MW-PCVD method of this invention.
Figure 3:
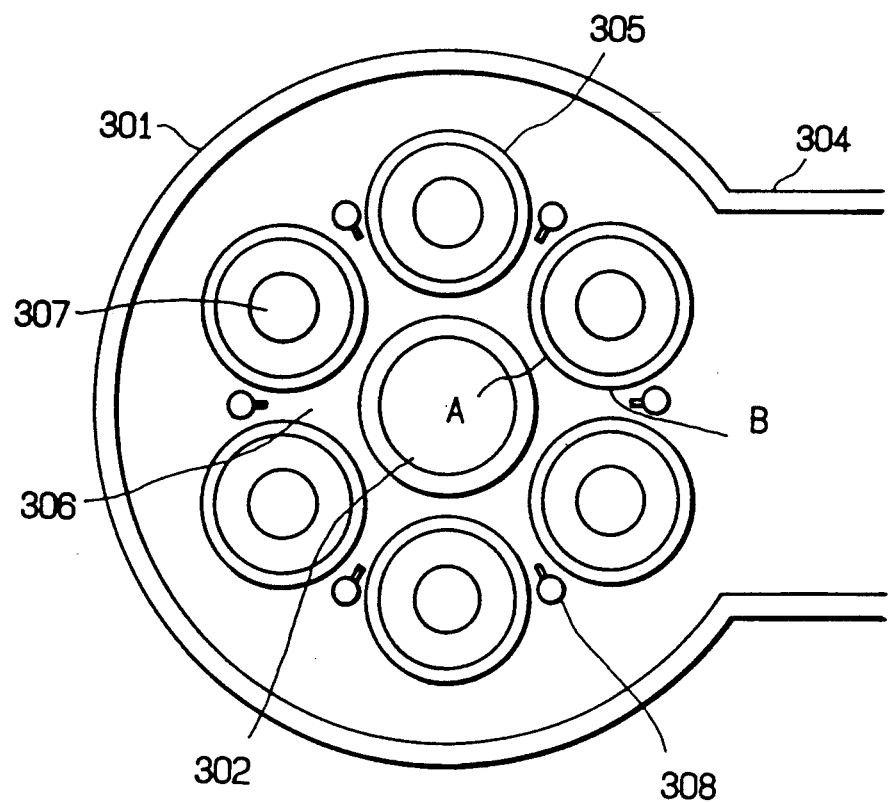
FIG. 3 is a schematic horizontal projection view of the apparatus shown in FIG. 2.

In order to overcome the foregoing problems of the known MW-PCVD method and to attain the objects as described above, the present inventors have conducted observations on the interrelation between the deposition rate of a raw material gas onto a substrate in a reaction chamber and microwave energy to be supplied to the raw material gas on the basis of the behavior of the raw material contributing to the formation of a deposited film on the substrate using the MW-PCVD apparatus shown in FIGS. 2 and 3. As a result, the present inventors have to obtain the findings as described below and have accomplished this invention based on said findings.

That is, the above interrelation between the deposition rate and the microwave energy was observed by forming A-Si:H deposited film on a Corning's No. 7059 glass plate (product of Corning Glass Works, U.S.A.) being fixed to the slot at the surface of an aluminum cylindrical substrate in the reaction chamber of the apparatus shown in FIGS. 2 and 3 while coupling microwave energy of predetermined different powers for each case under the following conditions; gas used and its flow rate:

$SiH_4$ gas: 250 SCCM
inner pressure: 50 m Torr

Figure 4:
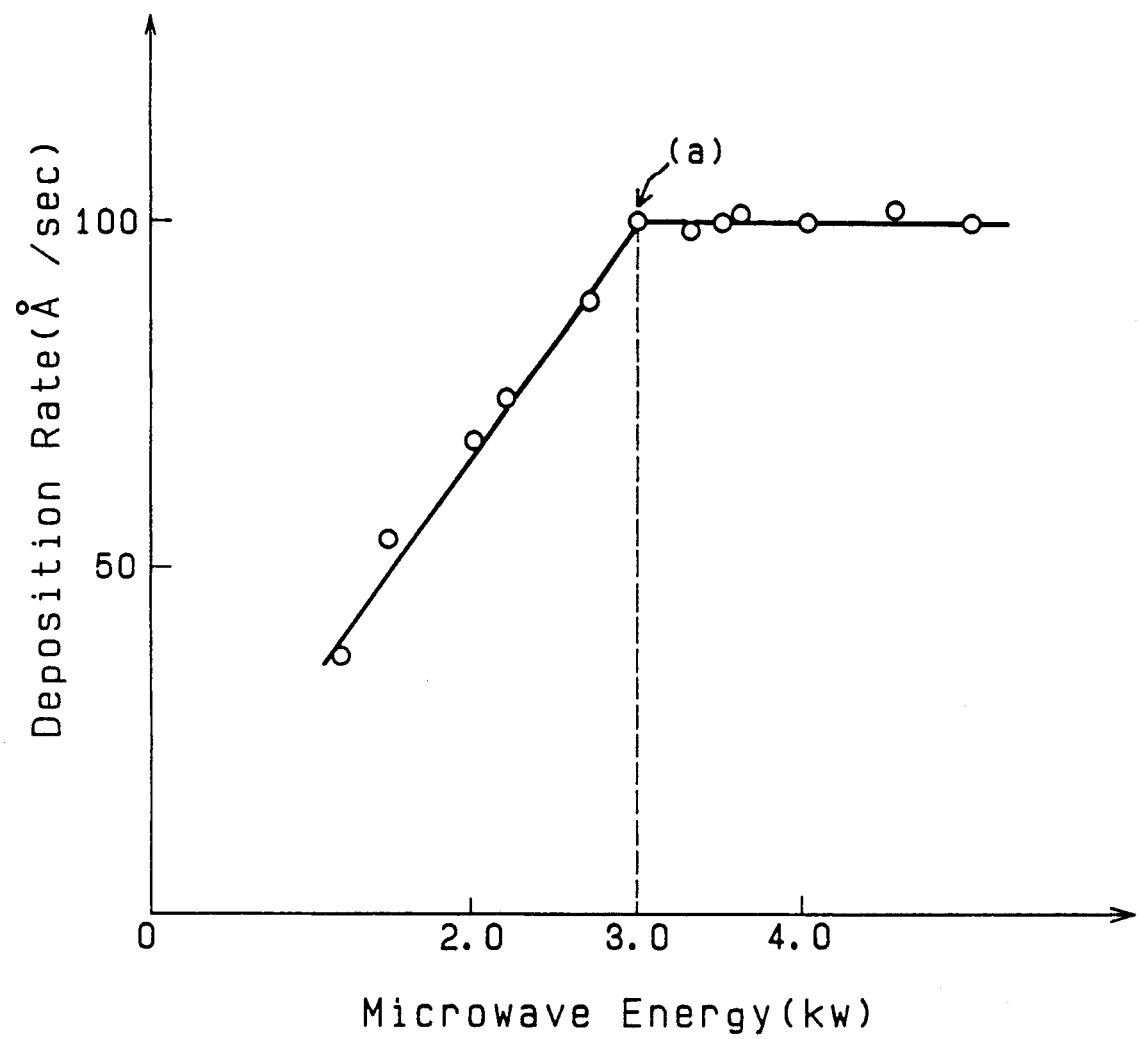
FIG. 4 is an experimental graph illustrating the interrelation between the deposition rate and the microwave energy.

As a result, there were obtained the results as shown in FIG. 4. In FIG. 4, the abscissa represents the power (KW) of microwave supplied and the ordinate represents the deposition rate of a film (Å/sec.). And the mark "(a)" represents the critical point for the deposition rate of a film to be saturated wherein the power of microwave supplied is 3.0 KW.

Then, another observation was made by repeating the above procedures except that the flow rate of $SiH_4$ gas was changed for each case. As a result, there were observed similar situations to the above.

Figure 1:
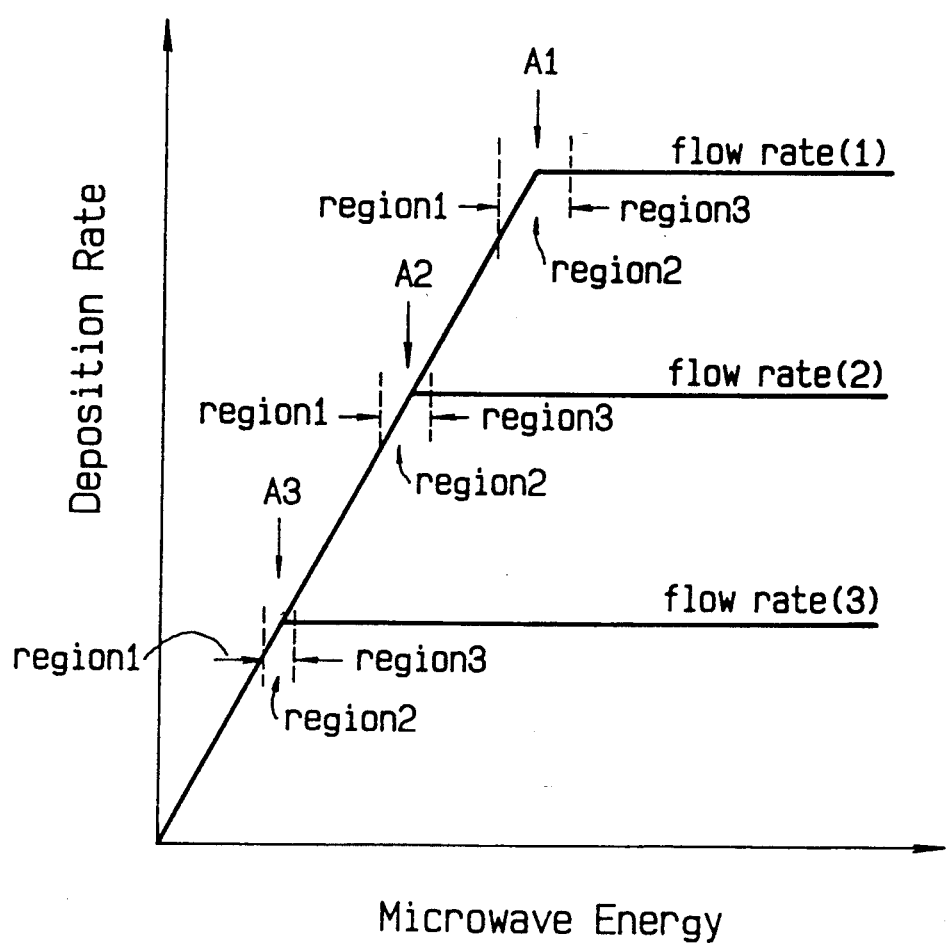
FIG. 1 is a schematic explanatory view of the principle of this invention.

All the results thus obtained were summarized and shown schematically in FIG. 1.

In FIG. 1, flow rates (1), (2) and (3) are of a raw material gas ($SiH_4$), and the flow rate (1) stands for the case where the flow rate of the raw material gas is the largest among the three cases. Accordingly, the flow rate (2) is the middle and the flow rate (3) is the smallest.

On the basis of what shown in FIG. 1, the present inventors have obtained the following information. That is, in the case of the flow rate (1); the deposition rate linearly increases along with increase in the power of microwave energy to be supplied up to a certain point $A_1$, (hereinafter referred to as "critical point $A_1$") where it becomes saturated (or maximized) and thereafter, it is maintained constant.

In the case of the flow rate (2), the progressive changes of the deposition rate against the microwave energy take similar trends to those in the case of the flow rate (1) except that the deposition rate becomes saturated and reaches critical point $A_2$ at an earlier stage than in the case of the flow rate (1) and thereafter, it is maintained constant as well.

In the case of the flow rate (3), the progressive changes of the deposition rate against the microwave energy take similar trends to those in the above two cases except that the deposition rate becomes saturated and reaches at an earlier stage than in the case of the flow rate (2) and thereafter, it is maintained constant as well.

Based upon the above progressive situation of the deposition rate from the interrelation between the flow rate of a raw material gas and the microwave energy and selecting three regions; region 1 where the deposition rate being in proportion to the increase in the power of the microwave energy to be supplied, region 2 near the critical point and region 3 where the deposition rate being saturated according to the graph shown in FIG. 1, the present inventors have examined the correlation between a film forming condition and the property of the resulting film under the condition with reference to the case of a hydrogenated amorphous (A-Si:H) deposited film in the way as described below.

That is, using the MW-PCVD apparatus shown in FIGS. 2 and 3 and using silane gas ($SiH_4$) as the raw material gas, there were formed three kinds of A-Si:H deposited films respectively under the respective film forming conditions corresponding to the regions 1, 2 and 3. And for each of the three cases, there were made observation during the film forming process and evaluation of the resultant deposited film.

As a result, the following facts were found in common among the flow rates (1), (2) and (3).

Firstly, as for the case of the region 1, under the film forming conditions corresponding to the region 1, there is observed a stronger luminescence for a silane decomposed active species SiH* rather than that for a hydrogen active species H* during the film forming process by means of plasma spectroanalysis. Silane gas is not sufficiently decomposed and the resulting decomposed species are not sufficiently activated, particularly when the film formation is carried out at a deposition rate of more than 50 Å/sec. As a result, such decomposed species which have not been sufficiently activated deposit on a substrate, so that three-dimensional coupling between silicon atoms hardly occurs. That is due to the insufficient amount of the hydrogen active species H* which initiates the chemical reaction among active species on the surface of the substrate. As for the resulting deposited film, it becomes such that the ratio of the photoconductivity versus the dark conductivity is small, the absorption based on the [$SiH_2$] is extremely large in comparison with that based on the [SiH] and a large amount of polysilicon is contained.

As for the case of the region 2, nearly one hundred percent of silane gas may be decomposed under the film forming conditions corresponding to the region 2, but there are generated certain active species which are not suited for film formation at high deposition rate or do not have a sufficient internal energy. Because of this, in the case where the film formation is attempted at a deposition rate of 50 Å/sec. or more, there is formed a deposited film which is insufficient in structure relaxation, that contains a disorder of dihedral angle and/or a weak Si-Si bond in large amounts within the film structure and that contains many traps. As for the ratio of the photoconductivity versus the dark conductivity for the resultant deposited film, it is almost satisfactory as far as an electrophotographic photosensitive member is concerned. However its response speed of photoconductivity against photocurrent is slow.

On the other hand, in the case of the region 3, the entire amount of silane gas is sufficiently decomposed under the film forming conditions corresponding to the region 3. In addition, even when the film formation is carried at a deposition rate of 50 Å/sec. or more, the entire amount silane gas is decomposed at a desired state and the resulting decomposed species are effectively activated with the actions of the microwave energy and isolated electrons to thereby generate desirable active species of a high internal energy, which are suited for the formation of a deposited film at high deposition rate. And, During the film forming process in the case of the region 3, there is observed a stronger luminescence for the hydrogen active species H* rather than for the active species SiH* and because of this, hydrogen atom are activated sufficient enough to initiate the chemical reaction among active species which results in the formation of a deposited film on the substrate. The resulting deposited film has an extremely desirable ratio of photoconductivity versus dark conductivity. Such that the response speed of the photoconductivity against light irradiation is remarkably high and contains only a slight amount of traps within the film structure.

From the above facts, it was found that a desired functional deposited film may be effectively formed at high deposition rate in the case where the film forming conditions are settled to the region 3 according to the graph shown in FIG. 1 where the deposition rate is saturated regardless of the flow rate of a raw material gas.

In order to generalize the above film forming conditions, the present inventors have made experimental observations about the power of microwaves to be supplied to a raw material gas. As a result, it was found that said microwave power is necessary to be 1.1 times or more but less than 5 times, preferably between 1.15 times and 4 times, and most preferably between 1.2 times and 3 times over the minimum microwave power required for the deposition rate to be saturated. It was also found that when the power of microwave to be supplied to a raw material gas is less than 1.1 times over that required for the deposition rate to be saturated, there cannot be formed a desired deposited film and the resulting deposited film has impractical characteristics. Likewise, when microwave power exceeds 5 times, ion impacts occur within the resulting plasmas which result in a deposited film having defects in its characteristics.

In addition to what were above described, the present inventors have made further experimental observations on the inner pressure under which the film forming process is to be carried out. As a result, there were clarified the following facts that in order to form a desired functional deposited film at a high deposition rate and with a high raw material gas utilization efficiency, it is necessary for the active species resulting from a raw material gas as a result of the decomposition and the activation with the action of the microwave energy to be transported onto the substrate while being maintained at a highly excited state; For that purpose, the mean free path of said active species excluding impact with an electron) is essential to be long enough: that in case where said mean free path is long, the once decomposed and excited active species may be not only activated for a long period of time but also collides again with electrons to thereby become excited; that the mean free path of an active species is necessary to be more than about 1 cm in view of the practical MW-PCVD apparatus for forming a functional deposited film; and that the inner pressure to meet these conditions is prefereably 10 m Torr or less, more preferably 3 m Torr or less, and most preferably between 0.1 m Torr and 1 m Torr.

When the inner pressure is regulated to a vacuum in the above range, occurrance of undesired polymerization reactions may be effectively prevented. It then becomes possible to secure the ion and electron densities necessary to maintain plasmas in a desired state while preventing the resulting deposited film from being damaged with the plasmas, whereby the chemical reaction among active species on the surface of the substrate being promoted to thereby form a functional deposited film on the substrate at high deposition rate.

This invention has been accomplished based on the above findings.

Therefore, according to one aspect of this invention, there is provided an improved method for forming a functional deposited film by introducing a raw material gas into a substantially enclosed reaction chamber containing a substrate onto which the functional deposited film is to be deposited and coupling microwave energy from a source of microwave energy thereinto to thereby form a glow discharge plasma causing decomposition of the raw material gas whereby forming the functional deposited film on the substrate, the improvement comprising supplying microwave of a power equivalent to 1.1 times or more over that microwave power with which the deposition rate, for the decomposed products which result from the raw material gas being deposited onto the substrate, to be saturated to the raw material gas in the reaction chamber.

According to another aspect of this invention, there is provided an improved method for forming a functional deposited film by introducing a raw material gas into a substantially enclosed reaction chamber containing a substrate onto which the fuctional deposited film is to be deposited and coupling microwave energy from a source of microwave energy thereinto to thereby form a glow discharge plasma causing decomposition of the raw material gas whereby forming the functional deposited film on the substrate, the improvement comprising supplying microwave of a power equivalent to 1.1 times or more over that of microwave power with which the deposition rate for the decomposed products from the raw material gas being deposited onto the substrate to be saturated to the raw material gas in the reaction chamber and regulating the inner pressure of the reaction chamber to a vacuum of 10 m Torr or less.

In order to make the MW-PCVD method of this invention more effective, the substrate temperature is also an important factor among others.

The substrate temperature is preferably 20° C. to 400° C., more preferably 100° C. to 350° C., and most preferably, 150° C. to 300° C.

As for the frequency of the microwave to be employed in the MW-PCVD method of this invention, it is possible to use the frequency in the range from 500 MHz to 100 GHz. But, it is preferably from 900 MHz to 50 GHz and more preferably, from 950 MHz to 10 GHz.

According to the MW-PCVD method of this invention, because microwave of a power which is larger than that of microwave with which the deposition rate being saturated is supplied to a raw material gas under a specific vacuum condition, the entire raw material gas becomes subjected to the action of microwave energy even in a mixed system comprising various kinds of raw material gases of different decomposition energies and because of this, all the decomposed species results from such raw material gas becoming effectively activated in a state suited for the formation of a functional deposited film on a substrate. Particularly, the resultant hydrogen atom becomes effectively activated to be an activated hydrogen H* in a desired state capable of effectively promoting the chemical reaction among active species on the surface of the substrate.

Further, in addition to this, because a film is deposited on a substrate under a low vacuum condition, the resulting film has an extremely reduced stress, has a desirably relaxed film structure and excels in adhesion to the substrate.

According to the MW-PCVD method of this invention, it is possible to make the resulting deposited film either n-type or p-type by appropriately doping it with an n-type impurity or a p-type impurity while controlling the amount of impurity present when the film is being formed.

According to the MW-PCVD method of this invention, there can be formed a desired functional deposited film having a wealth of many practically applicable characteristics and having an improved response speed against photocurrent at an improved deposition rate with a raw material gas utilization efficiency of one hundred percent or nearly hundred percent. The MW-PCVD method of this invention makes it possible to mass-produce various functional elements comprising such deposited film usable in an electrophotographic photosensitive member, photosensor, thin-film transistor, solar cell, etc. on an industrial scale thereby enabling low cost production.

The MW-PCVD method of this invention may be properly employed for the formation of not only a A-Si:H semiconductor film but also other semiconductor films such as A-Ge:H, A-SiGe:H, A-SiC:H, A-GeC:H, A-SiGeC:H, A-SiN:H, A-SiGeN:H, A-GeN:H, A-SiO:H, A-GeO:H, A-SiGeO:H, A-SiSn:H, A-SiPb:H and A-C:H semiconductor films.

As the raw material gas to form such semiconductor film, there can be used silane series gases such as $SiH_4$, $Si_2H_6$ and $Si_3H_8$ as the silicon atom imparting raw material gas: germane series gases such as $GeH_4$, and $Ge_2H_6$ as the germanium atom imparting raw material gas: hydrocarbon series gases such as $CH_4$, $C_2H_6$, $C_3H_8$, $C_2H_4$, $C_3H_6$, $C_2H_2$ and $C_6H_6$ as the carbon atom imparting raw material gas: tin atom containing gases such as $SnH_4$ and $Sn(CH_3)_4$ as the tin atom imparting raw material gas: lead atom containing gases such as $Pb(CH_3)_4$ and $Pb(C_2H_5)_6$ as the lead atom imparting raw material gas: nitrogen atom containing gases such as $N_2$ and $NH_3$ as the nitrogen atom imparting raw material gas: and oxygen atom containing gases such as $O_2$, CO, $CO_2$, $NO_2$ and $N_2O$ as the oxygen atom imparting raw material gas.

As the n-type impurity to make the foregoing semiconductor film n-type, an element of Group V of the Periodic Table is preferably used. And, an element of Group III of the Periodic Table is preferably used as the p-type impurity in order to make the foregoing semiconductor film p-type.

Examples of the Group III element are B, Al, Ga, In and Tl. Usable as the such Group III element imparting raw material gas are boron hydrides such as $B_2H_6$, $B_4H_{10}$, $B_5H_9$, $B_5H_{11}$, $B_6H_{10}$, $B_6H_{12}$ and $B_6H_4$ and other than these, $AlCl_3$, $GaCl_3$, $Ga(CH_3)_3$, $InCl_3$ and $TlCl_3$. Examples of the Group V element are P, As, Sb and Bi. Usable as the such Group V element imparting raw material gas are phosphorus hydrides such as $PH_3$ and $P_2H_4$ and other than these, $AsH_3$, $SbH_3$ and $BiH_3$.

The foregoing improved MW-PCVD method of this invention is not limited to the apparatus of the type as shown in FIGS. 2 and 3 but it can be effectively employed in any kind of MW-PCVD apparatus for forming a functional deposited film.

DESCRIPTION OF THE PREFERRED EMBODIMENTS

The advantages of this invention are now described in more detail by reference to the following Examples 1 through 14 which are provided here for illustrative purposes only, and are not intended to limit the scope of this invention.

In each of the examples, the corresponding semiconductor film is formed by the MW-PCVD method of this invention using the MW-PCVD apparatus shown in FIGS. 2 and 3.

FIG. 2 is a schematic cross-sectional view of the MW-PCVD apparatus suited for practicing the MW-PCVD method of this invention, and FIG. 3 is a schematic horizontal projection view of the apparatus shown in FIG. 2.

Referring FIG. 2 and FIG. 3 (the numerals in FIG. 3 will be shown in parentheses), the MW-PCVD apparatus suited for practicing the MW-PCVD method of this invention comprises substantially enclosed reaction chamber 201 (301) having reaction space (discharge space) 206 (306), microwave transmissive window made of alumina ceramics 202 (302), waveguide 203 for microwaves from a microwave power source (not shown), exhaust pipe 204 (304) being connected through a main valve to a diffusion pump (not shown), cylindrical substrate 205 (305) placed on a substrate holder in which electric heater 207 (307) is installed, gas feed pipe 208 (308) being connected through mass flow controllers (not shown) to gas reservoirs for raw material gases such as $SiH_4$, $GeH_4$, $H_2$, $CH_4$ and $B_2H_6$ and substrate rotating motor 210.

In the case of using a plane substrate, providing a slot in a size for supporting the plane substrate at the surface of the cylindrical substrate 205 (305), the plane substrate is fixed to the slot.

The formation of a functional deposited film (semiconductor film) by the MW-PCVD method of this invention using the apparatus shown in FIGS. 2 and 3 is carried out, for example, in the following way.

That is, cylindrical aluminum substrates 205 (305) are placed on the respective substrate holders in the reaction chamber 201 (301) and all the substrates are rotated by revolving the motor 210. Thereafter, the air in the reaction space 206 (306) is evacuated by the action of the diffusion pump to thereby bring the reaction space to a vacuum of about $10^{-6}$ Torr. Then the electric heaters 207 (307) are actuated to heat the substrates 205 (305) to a desired temperature (for example 200° C.) and they are kept at this temperature. Successively, a raw material gas is introduced through the feed pipes 208 (308) into the reaction space 206 (306) at a predetermined flow rate. Then, the inner pressure is adjusted to a predetermined vacuum (for example 0.5 m Torr) by regulating the main valve.

After the flow rate of the raw material gas and the vacuum of the reaction chamber becomes stable, microwave of a power equivalent to 1.1 times or more over that of the microwave required for the deposition rate to be saturated is supplied to the raw material gas in the reaction space to thereby decompose the raw material gas and activate the decomposed species to generate desired active species resulting in the formation of a desired semiconductor film on each substrate.

EXAMPLE 1

There were formed a plurality of A-Si:H semiconductor films (Sample Nos. 101 to 109) on the respective plane substrates following the foregoing procedures using the apparatus shown in FIGS. 2 and 3 and under the conditions of microwave power and deposition rate which are shown in Table 1.

As the plane substrate, there was used a Corning's No. 7059 glass plate of 1 mm in thickness and 10 cm×5 cm in size.

As the raw material gas, there was used $SiH_4$ gas. The $SiH_4$ gas was introduced into the reaction space at a flow rate of 250 SCCM. And the inner pressure at the time of forming the above film was adjusted to a vacuum of 50 m Torr.

Each of the resultant samples was then placed in another vacuum chamber (not shown) and a gap shaped Al electrode was formed on the surface of the previously formed film in accordance with a known vacuum deposition method. Then, the electric characteristics were examined on each sample by Microcurrent Ammeter 4140B, product of YHP Co., Ltd. There was used a solar simulator of AMI as the light source for measuring a dark conductivity. And there were used LED of 750 nm in wavelength and a known pulse generator for measuring a response speed against photocurrent.

As a result, there were obtained the results as shown in Table 1.

As Table 1 illustrates, it is understood that the semiconductor films (Sample Nos. 105 to 109) formed in accordance with the MW-PCVD method of this invention wherein the microwave power supplied being 3.3 KW or more corresponding to 1.1 times or more over that of the microwave power required for the deposition rate to be saturated, that is 3.0 KW, are surpassing others in every item of the dark conductivity, light conductivity and response speed against photocurrent.

It was also found that the raw material gas utilization efficiency in the formation of each of Samples Nos. 105 to 109 was essentially or substantially one hundred percent.

EXAMPLE 2

Figure 5:
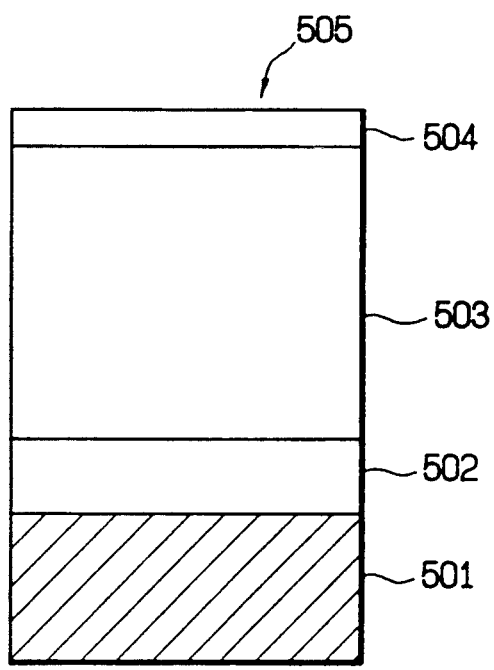
FIG. 5 is a fragmentary sectional view of an electrophotographic photosensitive member prepared in accordance with the MW-PCVD method of this invention.

Following the foregoing procedures using the apparatus shown in FIGS. 2 and 3, there was prepared an electrophotographic photosensitive member having the configuration shown in FIG. 5, in which is shown electrophotographic member 505 having a light receiving layer constituted with change injection inhibition layer (first layer) 502, photoconductive layer (second layer) 503 and surface layer (third layer) 504 on cylindrical aluminum substrate of 108 $\phi$ in size 501.

Each of the first to third layers was formed under the film forming conditions shown in Table 2.

The resultant electrophotographic photosensitive member was set to a known Canon's electrophotographic copying machine NP 7550 (product of CANON KABUSHIKI KAISHA) to examine charge-retentivity.

As a result, it was found that the charge-retentivities of the first layer and second layers are surpassed about 10% over those of an electrophotographic photosensitive member prepared under other film forming conditions out of the film forming conditions of the MW-PCVD method of this invention.

It was also found that the photosensitivity of the above resultant electrophotographic photosensitive member surpassed more than 10% over that of the aforesaid comparative electrophotographic photosensitive member.

It was further found that the above resultant electrophotographic photosensitive member does not cause problems concerning ghosts and excels in the electrophotographic characteristics.

EXAMPLE 3

Following the procedures of Example 1, there was formed a A-SiGe:H semiconductor film on a plane glass substrate under the following film forming conditions; gas used and its flow rate:
$SiH_4$: 100 SCCM
$GeH_4$: 100 SCCM
inner pressure: 40 m Torr
power of microwave: 5 KW
substrate temperature: 200° C.

As a result of observing the deposition rate, it was found that the above semiconductor film was formed at a deposition rate of 81 Å/sec.

And, as a result of examining the electric characteristics for the resultant semiconductor film in the same way as in Example 1, it was found that its response speed against photocurrent surpassed more than 30% over that of a A-SiGe:H semiconductor film prepared in accordance with a known MW-PCVD method.

EXAMPLE 4

Following the foregoing procedures of the MW-PCVD method according to this invention using the apparatus shown in FIGS. 2 and 3, there was formed a A-SiGe:H semiconductor film of 1 $\mu$m in thickness on a quartz plate under the film forming conditions shown in Table 3. Likewise, there was formed another A-SiGe:H semiconductor film of 1 $\mu$m in thickness on the same kind quartz plate as the above following the procedures of a known MW-PCVD method under the film forming conditions shown in the column "prior art" of Table 3.

For each of the two semiconductor films, there was measured ESR (electron spin resonance: the number of dangling bonds for silicon atoms or germanium atoms within the structure of a film can be measured) in accordance with a conventional method.

As a result, there were obtained the results shown in Table 3.

As Table 3 illustrates, it is understood that the ESR value of the semiconductor film prepared in accordance with the MW-PCVD method of this invention is fewer by one digit than that of the semiconductor film prepared in accordance with the known MW-PCVD method.

And, as a result of measuring an infrared absorption spectrum for the semiconductor film prepared in accordance with the MW-PCVD method of this invention, there were observed only absorptions of Si-H bond and Ge-H bond.

Further, the above two procedures were separately repeated, except that there was used a Corning's No. 7059 glass plate instead of the quartz plate in each case, to thereby obtain two kinds of A-SiGe:H semiconductor films of 20 $\mu$m in thickness.

As a result of examining the film peeling-off situation for each of them, there occurred a peeling-off for the semiconductor film prepared in accordance with the known MW-PCVD method but such phenomenon did not occur for the semiconductor film prepared with the MW-PCVD method of this invention.

EXAMPLE 5

Following the foregoing procedures of the MW-PCVD method according to this invention using the apparatus shown in FIGS. 2 and 3, there was formed a A-Sic:H semiconductor film of 1 μm in thickness on a quartz plate under the film forming conditions shown in Table 4. Likewise, there was formed another A-Sic:H semiconductor film of 1 μm in thickness on the same kind quartz plate as the above following the procedures of a known MW-PCVD method under the film forming conditions shown in the column "prior art" of Table 4.

For each of the two semiconductor films, there was measured ESR (electron spin resonance: the number of dangling bonds for silicon atoms within the structure of a film can be measured) in accordance with a conventional method.

As a result, there were obtained the results shown in Table 4.

As Table 4 illustrates, it is understood that the ESR value of the semiconductor film prepared in accordance with the MW-PCVD method of this invention is fewer by 1/20 than that of the semiconductor film prepared in accordance with the known MW-PCVD method.

Further, the above two procedures were separately repeated, except that there was used a cylindrical aluminum substrate instead of the quartz plate in each case, to thereby obtain two kinds of A-SIC:H semiconductor films of 30 μm in thickness.

As a result of examining the film peeling-off situation for each of them, there occurred a peeling-off for the semiconductor film prepared in accordance With the known MW-PCVD method but such did not occur for the semiconductor film prepared with the MW-PCVD method of this invention.

EXAMPLE 6

Following the foregoing procedures of the MW-PCVD method according to this invention using the apparatus shown in FIGS. 2 and 3, there was formed a A-SiN:H semiconductor film of 1 μm in thickness on a quartz plate under the film forming conditions shown in Table 5. Likewise, there was formed another A-SiN:H semiconductor film of 1 μm in thickness on the same kind quartz plate as the above following the procedures of a known MW-PCVD method under the film forming conditions shown in the column "prior art" of Table 5.

For each of the two semiconductor films, there was measured ESR (electron spin resonance: the number of dangling bonds for silicon atoms within the structure of a film can be measured) in accordance with a conventional method.

As a result, there were obtained the results shown in Table 3.

As Table 3 illustrates, it is understood that the ESR value of the semiconductor film prepared in accordance with the MW-PCVD method of this invention is fewer by 1/5 than that of the semiconductor film prepared in accordance with the known MW-PCVD method.

Further, the above two procedures were separately repeated, except that there was used a cylindrical aluminum substrate instead of the quartz plate in each case, to thereby obtained two kinds of A-SiN:H semiconductor films of 30 μm in thickness.

As a result of examining the film peeling-off situation for each of them, there occurred a peeling-off for the semiconductor film prepared in accordance with the known MW-PCVD method but such did not occur the semiconductor film prepared with the MW-PCVD method of this invention.

EXAMPLE 7

Following the foregoing procedures of the MW-PCVD method according to this invention using the apparatus shown in FIGS. 2 and 3, there were formed a plurality of doped A-SiGe:H semiconductor films of 1 μm in thickness on a Corning's No. 7059 glass plate respectively under the film forming conditions shown in Tables 6, 7 and 8. Likewise, there were formed another doped A-SiGe:H semiconductor films of 1 μm in thickness respectively on the same kind glass plate as the above following the procedures of a known MW-PCVD method under the film forming conditions shown in the column "prior art" of Tables 6, 7 and 8.

Each of the resultant samples was then placed in another vacuum chamber (not shown) and a comb shaped Al electrode was formed on the surface of the previously formed film in accordance with a known vacuum deposition method. Then, the dark conductivity was measured for every sample using Microcurrent Ammeter 4140 (product of YHP Co., Ltd.)

As a result, there were obtained the results as shown in Tables 6, 7 and 8.

As every Table illustrates, it is understood that the dark conductivity for any of the resultant deposited semiconductor films prepared in accordance with the MW-PCVD method of this invention surpasses that for any of the resultant doped semiconductor films prepared in accordance with the known MW-PCVD method.

And, it is then found that the doping efficiency of the resultant doped semiconductor films prepared in accordance with the MW-PCVD method of this invention is also superior.

EXAMPLE 8

There were formed a plurality of A-Si:H semiconductor films (Sample Nos. 801 to 808) on the respective plane substrate following the foregoing procedures using the apparatus shown in FIGS. 2 and 3.

As the plane substrate, there was used a Corning's No. 7059 glass plate.

In every case, the film formation process was carried out under the film forming conditions shown in Table 9 except the substrate temperature was kept at 200° C., and SiH4 gas as the raw material gas was introduced into the reaction chamber at the flow rate of 250 SCCM.

Each of the resultant samples was then placed in another vacuum chamber (not shown) and a gap shaped Al electrode was formed on the surface of the previously formed film in accordance with a known vacuum deposition method. Then, the light conductivity and the dark conductivity were measured on each sample by Microcurrent Ammeter 4140B, product of YHP Co., Ltd.

As the light source for measuring the light conductivity, there was used He-Ne laser of 7 m W.

Further, the response speed against photocurrent on each of the samples was measured in accordance with a conventional method using LED of 750 nm in wavelength and a pulse generator.

As a result, there were obtained the results as shown in Table 9.

As Table 9 illustrates, it is understood that the semiconductor films (Sample Nos. 803 to 808) formed in accordance with the MW-PCVD method of this invention wherein the microwave power supplied being 5.0 corresponding to 1.1 times or more over that of the microwave power required for the deposition rate to be saturated, that is 3.0 KW, are surpassing others in every item of the dark conductivity, light conductivity and response speed against photocurrent.

It was also found that the raw material gas utilization efficiency in the formation of each of Samples Nos. 803 to 808 was essentially or substantially one hundred percent.

EXAMPLE 9

There were formed a plurality of A-Si:H semiconductor films (Sample Nos. 901 to 907) on the respective plane substrate following the foregoing procedures using the apparatus shown in FIGS. 2 and 3.

As the plane substrate, there was used a Corning's No. 7059 glass plate.

In every case, the film formation process was carried out under the film forming conditions shown in Table 10 except the substrate temperature was kept at 290° C., and $SiH_4$ gas as the raw material gas was introduced into the reaction chamber at the flow rate of 750 SCCM.

Each of the resultant samples was then placed in another vacuum chamber (not shown) and a gap shaped Al electrode was formed on the surface of the previously formed film in accordance with a known vacuum deposition method. Then, the light conductivity and the dark conductivity were measured on each sample by Microcurrent Ammeter 4140B, product of YHP Co., Ltd. As the light source for measuring the light conductivity, there was used He-Ne laser of 7 m W.

Further, the response speed against photocurrent on each of the samples was measured in accordance with a conventional method using LED of 750 nm in wavelength and a pulse generator. As a result, there were obtained the results as shown in Table 10.

As Table 10 illustrates, it is understood that the semiconductor films (Sample Nos. 902 to 907) formed in accordance with the MW-PCVD method of this invention wherein the microwave power supplied being 15 corresponding to 1.1 times or more over that of the microwave power required for the deposition rate to be saturated, that is 3.0 KW, are surpassing other sample (Sample No. 901) in every items of the ratio of the light conductivity/the dark conductivity and the response speed against photocurrent.

It was also found that the raw material gas utilization efficiency in the formation of each of Samples Nos. 902 to 907 was essentially or substantially one hundred percent.

EXAMPLE 10 AND COMPARATIVE EXAMPLE

(1) Example 10

Following the foregoing procedures using the apparatus shown in FIGS. 2 and 3, there was prepared an electrophotographic photosensitive member having the configuration shown in FIG. 5, in which is shown electrophotographic member 505 having a light receiving layer constituted with charge injection inhibition layer (first layer) 502, photoconductive layer (second layer) 503 and surface layer (third layer) 504 on cylindrical aluminum substrate of 108 φ in size 501.

Each of the first to third layers was formed under the film forming conditions shown in Table 11.

The resultant electrophotographic photosensitive member was set to a known Canon's electrophotographic copying machine NP 7550 (product of CANON KABUSHIKI KAISHA) to examine charge-retentivity.

As a result, it was found that the charge-retentivities of the first layer and second layers are surpassing more than 10% over those of an electrophotographic photosensitive member prepared under other film forming conditions out of the film forming conditions of the MW-PCVD method of this invention.

It was also found that the photosensitivity of the above resultant electrophotographic photosensitive member is surpassing more than 10% over that of the aforesaid comparative electrophotographic photosensitive member.

It was further found that the above resultant electrophotographic photosensitive member does not cause problems concerning ghosts and excels in the electrophotographic characteristics.

(2) Comparative Example

There was prepared an electrophotographic photosensitive member having the configuration shown in FIG. 5 in accordance with the known MW-PCVD method under the film forming conditions shown in Table 12.

As a result of evaluating the resultant electrophotographic photosensitive member in the same way as in Example 10, it was found that it is inferior to that of Example 10 in every evaluation item.

EXAMPLE 11

Following the foregoing procedures of the MW-PCVD method according to this invention using the apparatus shown in FIGS. 2 and 3, there was formed a A-SiGe:H semiconductor film of 1 μm in thickness on a quartz plate under the film forming conditions shown in Table 13. Likewise, there was formed another A-SiGe:H semiconductor film of 1 μm in thickness on the same kind quartz plate as the above following the procedures of a known MW-PCVD method under the film forming conditions shown in the column "prior art" of Table 13.

For each of the two semiconductor films, there was measured ESR (electron spin resonance: the number of dangling bonds for silicon atoms or germanium atoms within the structure of a film can be measured) in accordance with a conventional method.

As a result, there were obtained the results shown in Table 13.

As Table 13 illustrates, it is understood that the ESR value of the semiconductor film prepared in accordance with the MW-PCVD method of this invention is fewer by 1/50 than that of the semiconductor film prepared in accordance with the known MW-PCVD method.

And, as a result of measuring an infrared absorption spectrum for the semiconductor film prepared in accordance with the MW-PCVD method of this invention, there were observed only absorptions of Si-H bond and Ge-H bond.

Further, the above two procedures were separately repeated, except that there was used a Corning's No. 7059 glass plate in stead of the quartz plate in each case, to thereby obtained two kinds of A-SiGe:H semiconductor films of 20 μm in thickness.

As a result of examining the film peeling-off situation for each of them, there occurred a peeling-off for the semiconductor film prepared in accordance with the known MW-PCVD method but did not such phenomenon for the semiconductor film prepared with the MW-PCVD method of this invention.

EXAMPLE 12

Following the foregoing procedures of the MW-PCVD method according to this invention using the apparatus shown in FIGS. 2 and 3, there was formed a A-Sic:H semiconductor film of 1 μm in thickness on a quartz plate under the film forming conditions shown in Table 14. Likewise, there was formed another A-Sic:H semiconductor film of 1 μm in thickness on the same kind quartz plate as the above following the procedures of a known MW-PCVD method under the film forming conditions shown in the column "prior art" of Table 14.

For each of the two semiconductor films, there was measured ESR (electron spin resonance: the number of dangling bonds for silicon atoms or within the structure of a film can be measured) in accordance with a conventional method.

As a result, there were obtained the results shown in Table 14.

As Table 14 illustrates, it is understood that the ESR value of the semiconductor film prepared in accordance with the MW-PCVD method of this invention is fewer by 1/200 than that of the semiconductor film prepared in accordance with the known MW-PCVD method.

Further, the above two procedures were separately repeated, except that there was used an aluminum plate of 1 mm in thickness in stead of the quartz plate in each case, to thereby obtained two kinds of A-Sic:H semiconductor films of 30 μm in thickness.

As a result of examining the film peeling-off situation for each of them, there occurred a peeling-off for the semiconductor film prepared in accordance with the known MW-PCVD method but did not such phenomenon for the semiconductor film prepared with the MW-PCVD method of this invention.

EXAMPLE 13

Following the foregoing procedures of the MW-PCVD method according to this invention using the apparatus shown in FIGS. 2 and 3, there was formed a A-SiN:H semiconductor film of 1 μm in thickness on a quartz plate under the film forming conditions shown in Table 15. Likewise, there was formed another A-SiGe:H semiconductor film of 1 μm in thickness on the same kind quartz plate as the above following the procedures of a know MW-PCVD method under the film forming conditions shown in the column "prior art" of Table 15.

For each of the two semiconductor films, there was measured ESR (electron spin resonance: the number of dangling bonds for silicon atoms within the structure of a film can be measured) in accordance with a conventional method.

As a result, there were obtained the results shown in Table 15.

As Table 15 illustrates, it is understood that the ESR value of the semiconductor film prepared in accordance with the MW-PCVD method of this invention is fewer by 1/20 than that of the semiconductor film prepared in accordance with the known MW-PCVD method.

Further, the above two procedures were separately repeated, except that there was used an aluminum plate of 1 mm in thickness in stead of the quartz plate in each case, to thereby obtained two kinds of A-SiN:H semiconductor films of 30 μm in thickness.

As a result of examining the film peeling-off situation for each of them, there occurred a peeling-off for the semiconductor film prepared in accordance with the known MW-PCVD method but did not such phenomenon for the semiconductor film prepared with the MW-PCVD method of this invention.

EXAMPLE 14

Following the foregoing procedures of the MW-PCVD method according to this invention using the apparatus shown in FIGS. 2 and 3, there were formed a plurality of doped A-SiGe:H semiconductor films of 1 μm in thickness on a Corning's No. 7059 glass plate respectively under the film forming conditions shown in Tables 16, 17 and 18. Likewise, there were formed another doped A-SiGe:H semiconductor films of 1 μm in thickness respectively on the same kind glass plate as the above following the procedures of a known MW-PCVD method under the film forming conditions shown in the column "prior art" of Tables 16, 17 and 18.

Each of the resultant samples was then placed in another vacuum chamber (not shown) and a comb shaped Al electrode was formed on the surface of the previously formed film in accordance with a known vacuum deposition method. Then, the dark conductivity was measured for every sample using Microcurrent Ammeter 4140 (product of YHP Co., Ltd.)

As a result, there were obtained the results as shown in Tables 16, 17 and 18.

As every Table illustrates, it is understood that the dark conductivity for any of the resultant deposed semiconductor films prepared in accordance with the MW-PCVD method of this invention is surpassing that for any of the resultant doped semiconductor films prepared in accordance with the known MW-PCVD method.

And, it is then found that the doping efficiency of the resultant doped semiconductor films prepared in accordance with the MW-PCVD method of this invention is surpassing also.

TABLE 1

| Sample No. | Microwave energy (KW) (2.45 GHz) | Deposition rate (Å/sec) | Substrate temperature (°C.) | Dark conductivity* | Light conductivity* | Response speed against photocurrent* |
|---|---|---|---|---|---|---|
| 101 | 1.2 | 37 | 150 | x | x | x |
| 102 | 2.0 | 68 | 150 | x | x | x |
| 103 | 2.7 | 89 | 150 | x | x | x |
| 104 | 3.0 | 100 | 150 | ○ | ○ | x |
| 105 | 3.3 | 99 | 150 | ○ | ○ | ○ |
| 106 | 3.5 | 100 | 150 | ○ | ⊙ | ○ |
| 107 | 3.6 | 102 | 150 | ⊙ | ⊙ | ⊙ |
| 108 | 4.0 | 100 | 150 | ⊙ | ⊙ | ⊙ |

TABLE 1-continued

| Sample No. | Microwave energy (KW) (2.45 GHz) | Deposition rate (Å/sec) | Substrate temperature (°C.) | Dark conductivity* | Light conductivity* | Response speed against photocurrent* |
|---|---|---|---|---|---|---|
| 109 | 5.0 | 100 | 150 | ◉ | ◉ | ◉ |

*As an electrophotographic photosensitive member;
x: practically inapplicable
Δ: practically applicable
○: good
◉: excellent

TABLE 2

| Layer | Raw material gas | Flow rate (SCCM) | Microwave energy (KW) (1 GHz) | Substrate temperature (°C.) | Inner pressure (m Torr) | Deposition rate (Å/sec) | Layer thickness (μm) |
|---|---|---|---|---|---|---|---|
| First layer | SiH$_4$<br>B$_2$H$_6$/H$_2$ (=3%)<br>NO | 250<br>25<br>10 | 4.0 | 290 | 20 | 100 | 3.0 |
| Second layer | SiH$_4$ | 250 | 4.0 | 290 | 20 | 100 | 22.0 |
| Third layer | SiH$_4$<br>CH$_4$ | 10<br>600 | 3.5 | 290 | 20 | 4.0 | 0.5 |

TABLE 3

| | Raw material gas and flow rate (SCCM) | | Microwave energy (KW) (2.45 GHz) | Inner pressure (m Torr) | Substrate temperature (°C.) | Deposition rate (Å/sec) | ESR (relative value) |
|---|---|---|---|---|---|---|---|
| Prior art | GeH$_4$<br>SiH$_4$ | 100<br>100 | 2.4 | 50 | 270 | 80<br>[Deposition efficiency ~ 100%] | 10 |
| This invention | GeH$_4$<br>SiH$_4$ | 100<br>100 | 5.0 | 0.8 | 200 | 80<br>[Deposition efficiency ~ 100%] | 0.2 |

TABLE 4

| | Raw material gas and flow rate (SCCM) | | Microwave energy (KW) (2.45 GHz) | Internal pressure (m Torr) | Substrate temperature (°C.) | Deposition rate (Å/sec) | ESR (relative value) |
|---|---|---|---|---|---|---|---|
| Prior art | C$_2$H$_2$<br>SiH$_4$ | 100<br>500 | 6.0 | 40 | 250 | 200<br>[Deposition efficiency ~ 100%] | 10 |
| This invention | C$_2$H$_2$<br>SiH$_4$ | 100<br>500 | 9.0 | 40 | 200 | 200<br>[Deposition efficiency ~ 100%] | 0.5 |

TABLE 5

| | Raw material gas and flow rate (SCCM) | | Microwave energy (KW) (2.45 GHz) | Inner pressure (m Torr) | Substrate temperature (°C.) | Deposition rate (Å/sec) | ESR (relative value) |
|---|---|---|---|---|---|---|---|
| Prior art | NH$_3$<br>SiH$_4$ | 100<br>300 | 3.6 | 50 | 250 | 120<br>[Deposition efficiency ~ 100%] | 10 |
| This invention | NH$_3$<br>SiH$_4$ | 100<br>300 | 5.0 | 50 | 190 | 120<br>[Deposition efficiency ~ 100%] | 2 |

TABLE 6

| | Raw material gas and flow rate (SCCM) | | Microwave energy (KW) (2.45 GHz) | Inner pressure (m Torr) | Substrate temperature (°C.) | Deposition rate (Å/sec) | Dark conductivity (relative value) |
|---|---|---|---|---|---|---|---|
| Prior art | SiH$_4$<br>GeH$_4$<br>B$_2$H$_6$/H$_2$ (=1%) | 100<br>100<br>1 | 2.4 | 30 | 250 | 80<br>[Deposition efficiency ~ 100%] | 1 |
| This invention | SiH$_4$<br>GeH$_4$<br>B$_2$H$_6$/H$_2$ (=1%) | 100<br>100<br>1 | 6.0 | 30 | 250 | 80<br>[Deposition efficiency ~ 100%] | 10 |

TABLE 7

| | Raw material gas and flow rate (SCCM) | Microwave energy (KW) | Inner pressure (m Torr) | Substrate temperature (°C.) | Deposition rate (Å/sec) | Dark conductivity (relative value) |
|---|---|---|---|---|---|---|
| Prior art | SiH$_4$<br>PH$_3$/H$_2$<br>(=3000 ppm) | 250<br>83 | 3.0 (2.45 GHz) | 40 | 250 | 100<br>[Deposition efficiency ~ 100%] | 1 |
| This invention | SiH$_4$<br>PH$_3$/H$_2$<br>(=3000 ppm) | 250<br>83 | 5.0 (5 GHz) | 40 | 250 | 100<br>[Deposition efficiency ~ 100%] | 10 |

TABLE 8

| | Raw material gas and flow rate (SCCM) | Microwave energy (KW) (2.45 GHz) | Inner pressure (m Torr) | Substrate temperature (°C.) | Deposition rate (Å/sec) | Dark conductivity (relative value) |
|---|---|---|---|---|---|---|
| Prior art | SiH$_4$<br>B$_2$H$_6$/H$_2$<br>(=3000 ppm) | 500<br>166 | 6.0 | 50 | 250 | 200<br>[Deposition efficiency ~ 100%] | 1 |
| This invention | SiH$_4$<br>B$_2$H$_6$/H$_2$<br>(=3000 ppm) | 500<br>166 | 9.0 | 0.8 | 250 | 200<br>[Deposition efficiency ~ 100%] | 10.5 |

TABLE 9

| Sample No. | Microwave energy (KW) (2.45 GHz) | Inner pressure (m Torr) | Deposition rate (Å/sec) | Light conductivity Dark conductivity* | Response speed* |
|---|---|---|---|---|---|
| 801 | 3.0 | 100 | 120.0 | 1.0 | 1.0 |
| 802 | 3.0 | 50 | 120.0 | 1.1 | 1.3 |
| 803 | 5.0 | 10 | 120.0 | 2.0 | 2.4 |
| 804 | 5.0 | 5 | 120.0 | 3.0 | 2.8 |
| 805 | 5.0 | 3 | 120.0 | 5.0 | 3.2 |
| 806 | 5.0 | 1 | 120.0 | 10.0 | 7.8 |
| 807 | 5.0 | 0.4 | 120.0 | 11.0 | 10.0 |
| 808 | 5.0 | 0.1 | 120.0 | 12.0 | 9.0 |

*relative comparison

TABLE 10

| Sample No. | Microwave energy (KW) (2.45 GHz) | Inner pressure (m Torr) | Deposition rate (Å/sec) | Light conductivity Dark conductivity* | Response speed* |
|---|---|---|---|---|---|
| 901 | 3.0 | 50 | 300 | 1.0 | 1.0 |
| 902 | 15 | 10 | 300 | 2.0 | 1.7 |
| 903 | 15 | 5 | 300 | 2.8 | 3.0 |
| 904 | 15 | 3 | 300 | 4.5 | 3.7 |
| 905 | 15 | 1 | 300 | 8.5 | 5.6 |
| 906 | 15 | 0.4 | 300 | 9.0 | 8.2 |
| 907 | 15 | 0.1 | 300 | 10.0 | 8.8 |

*relative comparison

TABLE 11

| Layer | Raw material gas | Flow rate (SCCM) | Inner pressure (m Torr) | Microwave energy (KW) (5 GHz) | Substrate temperature (°C.) | Deposition rate (Å/sec) | Layer thickness (μm) |
|---|---|---|---|---|---|---|---|
| First layer | SiH$_4$<br>B$_2$H$_6$/H$_2$ (=3%)<br>NO | 300<br>30<br>20 | 0.4 | 5.0 | 210 | 120 | 3.0 |
| Second layer | SiH$_4$ | 400 | 0.4 | 6.5 | 210 | 160 | 23.0 |
| Third layer | SiH$_4$<br>C$_2$H$_2$ | 100<br>200 | 0.4 | 3.5 | 210 | 40 | 0.5 |

TABLE 12

| Layer | Raw material gas | Flow rate (SCCM) | Inner pressure (m Torr) | Microwave energy (KW) (2.45 GHz) | Substrate temperature (°C.) | Deposition rate (Å/sec) | Layer thickness (μm) |
|---|---|---|---|---|---|---|---|
| First layer | SiH$_4$<br>B$_2$H$_6$/H$_2$ (=3%)<br>NO | 300<br>30<br>20 | 50 | 1.8 | 300 | 120 | 3.0 |

TABLE 12-continued

| Layer | Raw material gas | Flow rate (SCCM) | Inner pressure (m Torr) | Microwave energy (KW) (2.45 GHz) | Substrate temperature (°C.) | Deposition rate (Å/sec) | Layer thickness (μm) |
|---|---|---|---|---|---|---|---|
| Second layer | $SiH_4$ | 400 | 50 | 2.4 | 300 | 160 | 23.0 |
| Third layer | $SiH_4$ $C_2H_2$ | 100 200 | 50 | 0.6 | 300 | 40 | 0.5 |

TABLE 13

| | Raw material gas and flow rate (SCCM) | | Microwave energy (KW) (2.45 GHz) | Inner pressure (m Torr) | Substrate temperature (°C.) | Deposition rate (Å/sec) | ESR (relative value) |
|---|---|---|---|---|---|---|---|
| Prior art | $GeH_4$ $SiH_4$ | 100 100 | 2.4 | 50 | 290 | 80 [Deposition efficiency ~ 100%] | 10 |
| This invention | $GeH_4$ $SiH_4$ | 100 100 | 5.0 | 0.8 | 200 | 80 [Deposition efficiency ~ 100%] | 0.2 |

TABLE 14

| | Raw material gas and flow rate (SCCM) | | Microwave energy (KW) (2.45 GHz) | Inner pressure (m Torr) | Substrate temperature (°C.) | Deposition rate (Å/sec) | ESR (relative value) |
|---|---|---|---|---|---|---|---|
| Prior art | $C_2H_2$ $SiH_4$ | 100 500 | 6.0 | 40 | 290 | 200 [Deposition efficiency ~ 100%] | 10 |
| This invention | $C_2H_2$ $SiH_4$ | 100 500 | 9.0 | 0.8 | 290 | 200 [Deposition efficiency ~ 100%] | 0.05 |

TABLE 15

| | Raw material gas and flow rate (SCCM) | | Microwave energy (KW) (2.45 GHz) | Inner pressure (m Torr) | Substrate temperature (°C.) | Deposition rate (Å/sec) | ESR (relative value) |
|---|---|---|---|---|---|---|---|
| Prior art | $NH_3$ $SiH_4$ | 100 300 | 3.6 | 50 | 250 | 120 [Deposition efficiency ~ 100%] | 10 |
| This invention | $NH_3$ $SiH_4$ | 100 300 | 5.0 | 0.8 | 190 | 120 [Deposition efficiency ~ 100%] | 0.5 |

TABLE 16

| | Raw material gas and flow rate (SCCM) | | Microwave energy (KW) | Inner pressure (m Torr) | Substrate temperature (°C.) | Deposition rate (Å/sec) | Dark conductivity (relative value) |
|---|---|---|---|---|---|---|---|
| Prior art | $SiH_4$ $GeH_4$ $B_2H_6/H_2$ (=1%) | 100 100 1 | 2.4 (2.45 GHz) | 30 | 250 | 80 [Deposition efficiency ~ 100%] | 1 |
| This invention | $SiH_4$ $GeH_4$ $B_2H_6/H_2$ (=1%) | 100 100 1 | 6.0 (1 GHz) | 0.4 | 250 | 80 [Deposition efficiency ~ 100%] | 50 |

TABLE 17

| | Raw material gas and flow rate (SCCM) | | Microwave energy (KW) (2.45 GHz) | Inner pressure (m Torr) | Substrate temperature (°C.) | Deposition rate (Å/sec) | Dark conductivity (relative value) |
|---|---|---|---|---|---|---|---|
| Prior art | $SiH_4$ $PH_3/H_2$ (=3000 ppm) | 250 83 | 3.0 | 40 | 300 | 100 [Deposition efficiency ~ 100%] | 1 |
| This invention | $SiH_4$ $PH_3/H_2$ (=3000 ppm) | 250 83 | 5.0 | 0.1 | 250 | 100 [Deposition efficiency ~ 100%] | 70 |

TABLE 18

| | Raw material gas and flow rate (SCCM) | | Microwave energy (KW) | Inner pressure (m Torr) | Substrate temperature (°C.) | Deposition rate (Å/sec) | Dark conductivity (relative value) |
|---|---|---|---|---|---|---|---|
| Prior art | SiH$_4$<br>B$_2$H$_6$/H$_2$<br>(=3000 ppm) | 500<br>166 | 6.0<br>(2.45 GHz) | 50 | 300 | 200<br>[Deposition efficiency ~ 100%] | 1 |
| This invention | SiH$_4$<br>B$_2$H$_6$/H$_2$<br>(=3000 ppm) | 500<br>166 | 9.0<br>(5 GHz) | 0.8 | 300 | 200<br>[Deposition efficiency ~ 100%] | 90 |

What is claimed is:

1. A microwave plasma chemical vapor deposition process for the formation of a functional deposited film on a substrate by means of a microwave plasma chemical vapor deposition conducted in the film-forming space of a substantially enclosed film-forming chamber, wherein a film-forming raw material gas is introduced into said film-forming space and microwave energy is applied thereinto to form discharge plasma causing decomposition of said film-forming raw material gas thereby forming said functional deposited film on the substrate, characterized by maintaining the gaseous pressure of said film-forming space at a value of 10 mTorr or less and applying into said film-forming space a microwave power 1.1 times or more the minimum microwave power required to maximize the deposition rate for a decomposed product produced from said film-forming raw material gas to form a deposited film.

2. The process according to claim 1, including supplying the film-forming raw material gas into the film-forming space employing a gas feed pipe capable of supplying the film-forming raw material gas into the film-forming space, said gas feed pipe being longitudinally installed in the film-forming chamber.

3. The process according to claim 2, including providing said gas feed pipe between a pair of cylindrical substrate holders in said film-forming space.

4. The process according to claim 1, including supplying the film-forming raw material gas into the film-forming space employing a plurality of gas feed pipes being longitudinally installed in the film-forming chamber, each of said gas feed pipes being capable of supplying the film-forming raw material gas into the film-forming space.

5. The process according to claim 4, including providing a plurality of pairs of cylindrical substrate holders in said film-forming space and providing said plurality of gas feed pipes between each pair of said cylindrical substrate holders.

6. The process according to claim 1 including providing a plurality of cylindrical substrates in said film-forming space, each said cylindrical substrate positioned on a cylindrical substrate holder.

* * * * *

UNITED STATES PATENT AND TRADEMARK OFFICE
CERTIFICATE OF CORRECTION

PATENT NO. : 5,061,511
DATED : October 29, 1991
INVENTOR(S) : KEISHI SAITOH, ET AL.

It is certified that error appears in the above-identified patent and that said Letters Patent is hereby corrected as shown below:

COLUMN 1

Line 50, "the" should be deleted.
Line 64, "to" should read --to be--.

COLUMN 2

Line 25, "foreging" should read --foregoing--.

COLUMN 3

Line 9, "to obtain" should read --obtained--.
Line 42, "what" should read --what is--.
Line 44, "(1);" should read --(1),--.
Line 61, "reaches" should read --reaches critical point $A_3$--.

COLUMN 4

Line 15, "observation" should read --observations--.
Line 61, "carried" should read --carried out--.
Line 62, "amount" should read --amount of--.
Line 68, "And," should be deleted.

COLUMN 5

Line 3, "atom" should read --atoms--.
Line 8, "conductivity. Such" should read --conductivity, such--.
Line 47, "state;" should read --state.--.
Line 48, "excluding" should read --(excluding--.
Line 58, "prefereably" should read --preferably--.

UNITED STATES PATENT AND TRADEMARK OFFICE
CERTIFICATE OF CORRECTION

PATENT NO. : 5,061,511

DATED : October 29, 1991

INVENTOR(S) : KEISHI SAITOH, ET AL.

It is certified that error appears in the above-identified patent and that said Letters Patent is hereby corrected as shown below:

COLUMN 6

Line 25, "fuctional" should read --functional--.
Line 58, "results" should read --resulting--.
Line 59, "becoming" should read --become--.

COLUMN 8

Line 19, "Referring" should read --Referring to--.

COLUMN 9

Line 36, "are surpassing" should read --surpasses--.
Line 62, "layers are surpassed" should read --layer surpassed--.

COLUMN 10

Line 37, "kind" should read --kind of--.

COLUMN 11

Line 6, "A-Sic:H" should read --A-Si:H--.
Line 8, "A-Sic:H" should read --A-Si:H--.
Line 28, "A-SIC:H" should read --A-SiC:H--.
Line 32, "With" should read --with--.
Line 63, "obtained" should read --obtain--.
Line 68, "occur" should read --occur for--.

COLUMN 12

Line 11, "another" should read --another plurality of--.
Line 23, "4140" should read --4140B--.

UNITED STATES PATENT AND TRADEMARK OFFICE
CERTIFICATE OF CORRECTION

PATENT NO. : 5,061,511
DATED : October 29, 1991
INVENTOR(S) : KEISHI SAITOH, ET AL.

Page 3 of 4

It is certified that error appears in the above-identified patent and that said Letters Patent is hereby corrected as shown below:

COLUMN 13

Line 5, "are surpassing" should read --surpassed--.
Line 46, "are surpassing" should read --surpassed--.
Line 47, "every items of" should be deleted.

COLUMN 14

Line 7, "layers are surpassing" should read
   --layer surpassed--.
Line 14, "is surpassing" should read --surpassed--.
Line 64, "in stead" should read --instead--.
Line 65, "obtained" should read --obtain--.

COLUMN 15

Line 2, "did not such phenome-" should read --not--.
Line 3, "non" should be deleted.
Line 10, "A-Sic:H" should read --A-SiC:H--.
Line 12, "A-Sic:H" should read --A-SiC:H--.
Line 31, "in stead" should read --instead--.
Line 32, "obtained" should read --obtain-- and
   "A-Sic:H" should read --A-SiC:H--.
Line 37, "did not such phenome-" should read --not--.
Line 38, "non" should be deleted.
Line 48, "SiGe:H" should read --SiN:H--.
Line 50, "know" should read --known--.

COLUMN 16

Line 12, "in stead" should read --instead--.
Line 13, "obtained" should read --obtain--.

UNITED STATES PATENT AND TRADEMARK OFFICE
CERTIFICATE OF CORRECTION

PATENT NO. : 5,061,511

DATED : October 29, 1991

INVENTOR(S) : KEISHI SAITOH, ET AL.

It is certified that error appears in the above-identified patent and that said Letters Patent is hereby corrected as shown below:

COLUMN 16

Line 18, "did not such phenome-" should read --not--.
Line 19, "non" should be deleted.
Line 30, "other" should read --other plurality of--.
Line 41, "4140" should read --4140B--.
Line 45, "deposed" should read --deposited--.
Line 47, "is surpassing" should read --surpassed--.
Line 53, "is" should read --surpassed--.
Line 54, "surpassing" should be deleted.

Signed and Sealed this

Eighteenth Day of May, 1993

Attest:

MICHAEL K. KIRK

*Attesting Officer*  *Acting Commissioner of Patents and Trademarks*